United States Patent [19]

Kaganowicz et al.

[11] 4,355,052
[45] Oct. 19, 1982

[54] METHOD OF PREPARING AN ABRASIVE COATED SUBSTRATE

[75] Inventors: Grzegorz Kaganowicz, Princeton, N.J.; John W. Robinson, Levittown, Pa.

[73] Assignee: RCA Corporation, New York, N.Y.

[21] Appl. No.: 255,503

[22] Filed: Apr. 20, 1981

[51] Int. Cl.³ ........................ B05D 5/02; E05D 15/10
[52] U.S. Cl. ................................ 427/39; 51/209 DL
[58] Field of Search ........................ 427/38, 39, 40; 51/209 DL, 209 R, 394, 407

[56] References Cited

U.S. PATENT DOCUMENTS 4,104,832 8/1978 Keizer .............................. 51/281 R
4,260,647 4/1981 Wang et al. ........................ 427/40
4,282,268 8/1981 Priestley et al. .................... 427/40

OTHER PUBLICATIONS

Joyce et al., "Silicon Oxide and Nitride Films Deposited by an R.F. Glow-Discharge," *Thin Solid Films,* vol. 1, pp. 481–494, (1967–1968).

*Primary Examiner*—John H. Newsome
*Attorney, Agent, or Firm*—Birgit E. Morris

[57] ABSTRACT

An improved method for preparing an abrasive $SiO_x$ coating wherein $1 \leq x \leq 2$. The method includes the steps of submitting $SiH_4$ and $N_2O$ to glow discharge and depositing the $SiO_x$ product of the glow discharge onto a substrate. The improvement includes the additional step of adjusting the refractive index and thickness of the $SiO_x$ coating by means of the glow discharge deposition process parameters so as to maximize the abrasiveness of the $SiO_x$ coating.

14 Claims, 1 Drawing Figure

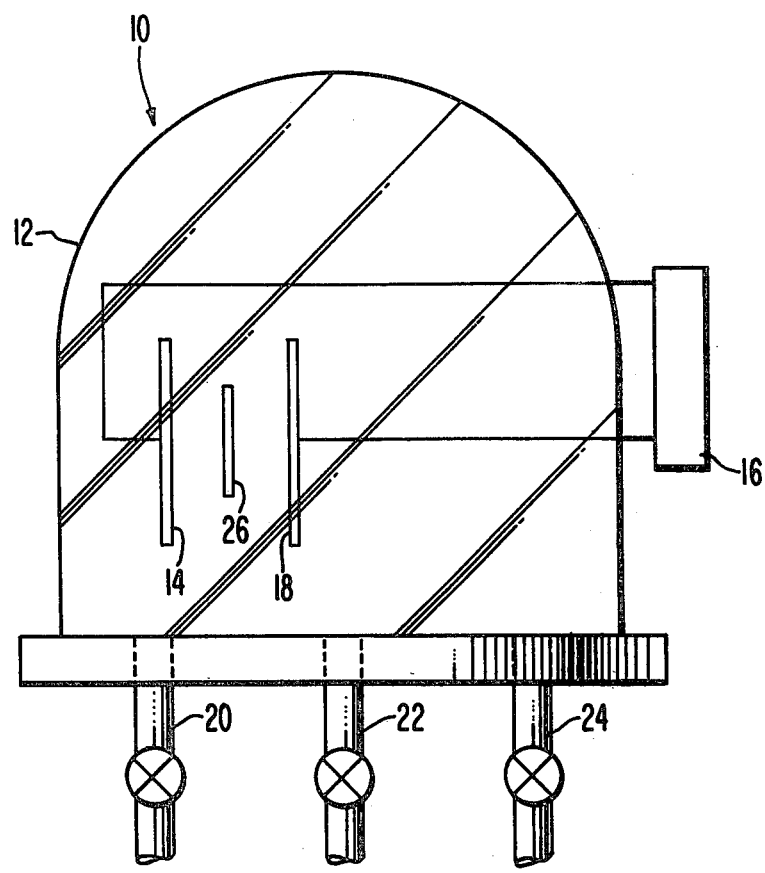

METHOD OF PREPARING AN ABRASIVE COATED SUBSTRATE

This invention relates to a method for preparing an abrasive coating. More particularly, this invention relates to a method for preparing an abrasive silicon oxide coating by a method which includes a glow discharge deposition.

BACKGROUND OF THE INVENTION

Kaganowicz, in a copending application, entitled "METHOD FOR PREPARING AN ABRASIVE COATING", Ser. No. 963,819, filed Nov. 27, 1978, discloses a method for preparing an abrasive silicon oxide coating on a substrate which includes subjecting to a glow discharge silane and a gaseous, oxygen-containing compound selected from the group consisting of $N_2O$, $H_2O$ and $CO_2$. The resulting silicon oxide coatings are abrasive enough to be employed in lapping hard materials such as diamond. However, an improved coating having increased abrasiveness which would decrease the time to lap an article would be useful for high volume production.

SUMMARY OF THE INVENTION

We have found an improvement to the method for preparing an abrasive silicon oxide coating by subjecting $SiH_4$ and $N_2O$ to a glow discharge thereby depositing a $SiO_x$ product onto a substrate. The improvement includes the additional step of adjusting the refractive index and thickness of the $SiO_x$ coating by means of the glow discharge deposition process parameters so as to maximize the abrasiveness of the $SiO_x$ coating.

BRIEF DESCRIPTION OF THE FIGURE

The FIGURE is a cross-sectional view of an apparatus suitable for depositing the abrasive coating.

DETAILED DESCRIPTION OF THE INVENTION

The abrasive silicon oxide coating of the instant invention may be viewed as a mixture of SiO and $SiO_2$. Thus, silicon oxide has the formula $SiO_x$ wherein $1 \leq x \leq 2$. The abrasive coating is prepared by first evacuating a vacuum chamber containing a suitable substrate. $N_2O$ is introduced and $SiH_4$ is then added. These precursors are subjected to a glow discharge which results in plasma formation as a result of exposure to an electromagnetic field. An $SiO_x$ coating, which is a product of the glow discharge of the precursors, is deposited on the substrate.

We have found that the abrasiveness of the deposited $SiO_x$ coating may be maximized by adjusting the refractive index and the thickness of the coating. For example, for coatings at least about 600 angstroms thick, improved abrasiveness is observed. Furthermore, the preferred refractive index for a more abrasive $SiO_x$ coating has been found to be between about 1.1 and 1.45.

The refractive index and thickness can be adjusted by means of the glow discharge deposition process parameters. Thus, the refractive index may be influenced by the partial pressure of the precursors, the pumping rate of the vacuum system, the rate at which the precursors enter the reaction chamber and the partial pressure ratio of the precursors. The thickness of the coating chosen may be other than that which maximizes abrasiveness if the time required or the steps needed to produce that thickness are not practical.

The conditions necessary to maximize the abrasiveness of the $SiO_x$ coating is system dependent. The method of adding the precursors, the size of the vacuum chamber and the reduced pressure level of the system all influence the refractive index and hence the abrasiveness of the coating.

It is surprising that the thickness of the coating and its refractive index are related to abrasiveness. These parameters were not thought to be correlated with the abrasive properties of a coating.

The invention will be further described by reference to the FIGURE.

A glow discharge apparatus suitable for preparing the abrasive material is shown in the FIGURE generally as 10. The glow discharge apparatus 10 includes a vacuum chamber 12 which can be a glass bell jar. In the vacuum chamber 12 are two electrodes 14 and 18 which can be a screen, coil or plate of a material that is a good electrical conductor and does not readily sputter, such as aluminum. The electrodes 14 and 18 are connected to a power supply 16, which may be DC or AC, to produce a voltage potential. An outlet 20 from the vacuum chamber 12 allows for evacuation of the system and is connected to a pumping station, not shown. A first inlet 22 and a second inlet 24 are connected to gas bleed systems, not shown, for adding the reactants employed to prepare the abrasive material.

In carrying out the process, a substrate 26 to be coated is placed between the electrodes 14 and 18, typically maintained about 5 to 15 centimeters apart. The vacuum chamber 12 is then evacuated through the outlet 20 to a pressure of about 0.5 to $1 \times 10^{-5}$ torr. $N_2O$ is added through a first inlet 22 to its desired partial pressure. $SiH_4$ is added through a second inlet 24 until the desired partial pressure ratio of $SiH_4$ to $N_2O$ is obtained.

In order to begin deposition of an abrasive coating on the substrate 26, a glow discharge is initiated between the electrodes 14 and 18 by energizing the power source 16. For deposition the current should be in the range of about 200 to 900 milliamps, preferably about 400 to 700 milliamps. Any convenient frequency such as 10 kilohertz or a radio frequency may be employed. The potential between electrodes 14 and 18 is generally about 1,000 volts.

Suitable substrates include glass, metal and plastics such as vinyl chloride homopolymers and copolymers. A preferred substrate is a copolymer or homopolymer of vinyl chloride coated with a metal layer. A preferred metal layer is a bi-layer comprising a first layer of 50 angstroms of Cu overlayed with a second layer of about 200 to 500 angstroms of Inconel 600, an alloy comprising 76.8 atom percent nickel, 13.8 atom percent chromium and 8.5 atom percent iron.

One application of the instant abrasive silicon oxide coating is in the shaping of a playback stylus for use with capacitive information disc records. A method for producing suitable styli was described in Keizer, U.S. Pat. No. 4,104,832. The stylus may be fabricated out of any hard dielectric material such as diamond, sapphire and the like. Diamond is presently preferred because of its long-wearing properties.

The invention will be further illustrated by the following Examples, but it is to be understood that the invention is not meant to be limited by the details described therein.

EXAMPLE 1

For each run a 30.5 centimeter diameter poly(vinyl chloride) disc containing a deep, coarse-pitched spiral groove coated with a metal bi-layer comprising a copper layer about 50 angstroms thick and a 200 angstrom thick layer of Inconel 600 (76.8 atom percent nickel, 13.8 atom percent chromium and 8.5 atom percent iron) was placed in a 46 centimeter by 76 centimeter bell jar as described in the FIGURE. The bell jar was then evacuated to a pressure of $1 \times 10^{-5}$ torr. $N_2O$ was added to a partial pressure of 32 micrometers of mercury using a flow rate as estimated by nitrogen flow of 31.4 standard cubic centimeters per minute (sccm). $SiH_4$ was then added to a partial pressure shown in Table 1. The flow rate of the $SiH_4$ was different for each run and was fixed by the flow rate of $N_2O$ and the desired partial pressure of $SiH_4$. The partial pressure ratio of $N_2O$ to $SiH_4$ is also shown in Table 1.

The disc substrate was rotated at a rate of 30 revolutions per minute (rpm) between two 15 centimeter by 15 centimeter aluminum electrodes. These electrodes covered a strip approximately 6 centimeters wide on the disc. To create a glow between the electrodes, 500 milliamps of current was supplied to the electrodes with a potential of about 1,000 volts at 10 kilohertz. Deposition of the $SiO_x$ coating continued until a thickness of about 250 angstroms was obtained. The thickness was estimated from the known deposition rate. The deposition time needed to obtain the 250 angstrom coating was about 2.5 minutes. The index of refraction was measured using a Rudolph Research Ellipsometer.

Four capacitive video disc playback stylus diamond support elements, which had been previously shoe-lapped so that their shoe length was 1.5 micrometers, were keel-lapped. The length of the shoe after keel-lapping was completed was measured. The shoe length attributable to the keel-lapping step was cubed in order to determine the amount of material removed. The relative abrasion rates shown in Table 1 are normalized based on the amount of material determined to have been removed with a value of 1 representing a coating which could not lap the diamond stylus.

TABLE 1

| Run Number | $SiH_4$ Partial Pressure (Micrometers of Mercury) | $N_2O/SiH_4$ Partial Pressure Ratio | $SiO_x$ Coating Index of Refraction | Relative Abrasion Rate |
|---|---|---|---|---|
| 1 | 2 | 16:1 | 1.3253 | 2.8 |
| 2 | 4 | 8:1 | 1.3923 | 4.1 |
| 3 | 6 | 5.3:1 | 1.4323 | 4.1 |
| 4 | 8 | 4:1 | 1.4576 | 2.3 |
| 5 | 10 | 3.2:1 | 1.4844 | 2.2 |
| 6 | 12 | 2.7:1 | 1.5076 | 1.8 |
| 7 | 16 | 2:1 | 1.5342 | 1.0 |

The results in Table 1 indicate that the relative abrasion rate is dependent on the index of refraction of the $SiO_x$ coating. As seen in runs 1 to 3, from an index of refraction of about 1.32 to about 1.43 there is an increase in the abrasiveness of the $SiO_x$ coating with increasing refractive index and then a plateau. Above a refractive index of about 1.45 the relative abrasion rate decreases with increasing index of refraction.

EXAMPLE 2

The same substrate, apparatus and procedures employed in Example 1 were used in this Example. The influence of $N_2O$ flow rate, $N_2O$ partial pressure and the $N_2O/SiH_4$ partial pressure ratios on the index of refraction and coating thickness of the $SiO_x$ coating deposited was examined. The results are summarized in Table 2.

TABLE 2

| Run Number | $N_2O$ Partial Pressure (Micrometers of Mercury) | $SiH_4$ Partial Pressure (Micrometers of Mercury) | $N_2O/SiH_4$ Partial Pressure Ratio | $N_2O$ Flow Rate (sccm) | $SiO_x$ Coating Thickness (Angstroms) | $SiO_x$ Coating Index of Refraction |
|---|---|---|---|---|---|---|
| 8 | 20 | 2.3 | 8.7:1 | 14.2 | 1,105.7 | 1.4396 |
| 9 | 32 | 2.0 | 16:1 | 23.6 | 217.0 | 1.2873 |
| 10 | 32 | 2.0 | 16:1 | 31.4 | 250.0 | 1.3253 |
| 11 | 40 | 2.3 | 17:1 | 30.2 | 430.0 | 1.3503 |
| 12 | 46 | 3.0 | 15.5:1 | 34.2 | 384.0 | 1.3923 |

These results indicate that the index of refraction may be varied by adjusting the partial pressure of $N_2O$ and the $N_2O$ flow rate even though the partial pressure ratio of $N_2O$ to $SiH_4$ remains relatively constant.

EXAMPLE 3

The procedures, substrate and apparatus of Example 1 were employed in these runs using a partial pressure of $N_2O$ of 32 micrometers of mercury, a partial pressure of $SiH_4$ of 5 micrometers of mercury, a flow rate of $N_2O$ of 31.4 sccm and a $SiH_4$ flow rate of 3.1 sccm. The flow rates were estimated based on $N_2$ flow rates. The results for the $SiO_x$ depositions are shown in Table 3.

TABLE 3

| Run Number | $SiO_x$ Coating Thickness (Angstroms) | $SiO_x$ Coating Index of Refraction | Relative Abrasion Rate |
|---|---|---|---|
| 13 | 125 | 1.332 | 3.7 |
| 14 | 250 | 1.359 | 3.9 |
| 15 | 403 | 1.378 | 4.3 |
| 16 | 589 | 1.403 | 4.0 |
| 17 | 687 | 1.365 | 6.5 |
| 18 | 705 | 1.418 | 5.8 |
| 19 | 920 | 1.417 | 6.8 |
| 20 | 1,496 | 1.377 | 8.3 |
| 21 | 2,500 | 1.343 | 8.0 |

The thickness for run number 21 was estimated from the deposition time. The results in Table 3 demonstrate the effect of thickness on abrasion rate. The index of refraction for these runs are within a relatively narrow range of between 1.332 and 1.418. Runs 13 through 16 which have thicknesses less than about 600 angstroms all have relative abrasion rates of 4.0. Runs 17 through 19 have thicknesses between 687 and 920 angstroms and have abrasion rates of around 6.5. For runs 20 and 21, where the thickness is well above 1,000 angstroms, the abrasion rates are 8.0 or greater. These results indicate that the lapping rate is strongly dependent on the coating thickness. There is no evidence for any of the runs reported herein that the stylus penetrated the $SiO_x$ coating and entered the substrate.

EXAMPLE 4

The materials, apparatus and procedures for Examples 1-3 were employed in this Example. The conditions employed and results are shown in Table 4.

TABLE 4

| Run Number | N$_2$O Partial Pressure (Micrometers of Mercury) | SiH$_4$ Partial Pressure (Micrometers of Mercury) | N$_2$O/SiH$_4$ Partial Pressure Ratio | N$_2$O Flow Rate (sccm) | SiO$_x$ Coating Thickness (Angstroms) | SiO$_x$ Coating Index of Refraction | Relative Abrasion Rate |
|---|---|---|---|---|---|---|---|
| 22 | 90  | 18 | 5:1  | 34.5 | 360 | 1.284  | 4.9 |
| 23 | 90  | 15 | 6:1  | 31.5 | 900 | 1.4145 | 9.8 |
| 24 | 180 | 5  | 36:1 | 34.5 | 600 | 1.2232 | 6.7 |
| 25 | 142 | 10 | 14:1 | 34.5 | 450 | —      | 5.9 |
| 26 | 90  | 15 | 6:1  | 31.5 | 300 | 1.4246 | 3.3 |

These results indicate that coatings having the desired index of refraction and, therefore, high relative abrasion rates may be obtained at a variety of N$_2$O partial pressures, SiH$_4$ partial pressures and N$_2$O/SiH$_4$ partial pressure ratios.

EXAMPLE 5

In this Example the N$_2$O and SiH$_4$ partial pressures as well as the N$_2$O/SiH$_4$ partial pressure ratios were kept relatively constant. However, the N$_2$O flow rate was varied. In keel-lapping test styli, a coarse-pitched groove was employed which was deep enough so that the bottom of the stylus did not reach the bottom of the lapping groove during the lapping operation. Each stylus was lapped for 45 seconds. The results including the estimated material removed on lapping are shown in Table 5. The materials, apparatus and procedures of Examples 1-4 were employed in this Example except as previously indicated.

TABLE 5

| Run Number | N$_2$O Partial Pressure (Micrometers of Mercury) | SiH$_4$ Partial Pressure (Micrometers of Mercury) | N$_2$O/SiH$_4$ Partial Pressure Ratio | N$_2$O Flow Rate (sccm) | SiO$_x$ Coating Thickness (Angstroms) | SiO$_x$ Coating Index of Refraction | Material Removed on Lapping (Cubic Micrometers) |
|---|---|---|---|---|---|---|---|
| 27 | 36 | 4.6 | 7.8:1 | 17.1 | 1,094 | 1.443 | 125 |
| 28 | 32 | 5.0 | 6.4:1 | 23.6 | 1,207 | 1.377 | 215 |
| 29 | 32 | 4.2 | 7.6:1 | 34.4 | 1,244 | 1.339 | 165 |

These results indicate that the N$_2$O flow rate may be used to obtain the desired index of refraction although the other starting material parameters are kept relatively constant.

We claim:

1. In a method for preparing an abrasive SiO$_x$ coating, wherein $1 \leq x \leq 2$, comprising the steps of submitting SiH$_4$ and N$_2$O to a glow discharge and depositing the SiO$_x$ product of the glow discharge onto a substrate;

the improvement comprising the additional step of adjusting the refractive index and thickness of the SiO$_x$ coating by means of the glow discharge deposition process parameters so as to maximize the abrasiveness of the SiO$_x$ coating.

2. A method in accordance with claim 1 wherein the thickness is at least about 600 angstroms.

3. A method in accordance with claim 1 wherein the refractive index is between about 1.1 and 1.45.

4. A method in accordance with claim 3 wherein the refractive index is between about 1.33 and 1.43.

5. A method in accordance with claim 1 wherein the substrate is a homopolymer or copolymer of vinyl chloride.

6. A method in accordance with claim 5 wherein the substrate surface is coated with a metal layer.

7. A method in accordance with claim 1 wherein the process parameters are selected from the group consisting of the N$_2$O flow rate, the SiH$_4$ flow rate, the partial pressure of N$_2$O, the partial pressure of SiH$_4$, and the partial pressure ratio of SiH$_4$ to N$_2$O.

8. In a method for lapping an article comprising the steps of submitting SiH$_4$ and N$_2$O to a glow discharge; depositing the product to obtain an abrasive SiO$_x$ coating, wherein $1 \leq x \leq 2$, onto a substrate; establishing relative motion between the article and the substrate; and contacting the article with the abrasive SiO$_x$ coating;

the improvement wherein the method comprises the additional step of adjusting the refractive index and thickness of the SiO$_x$ coating by means of the glow discharge deposition parameters so as to maximize the abrasiveness of the SiO$_x$ coating.

9. A method in accordance with claim 8 wherein the thickness is at least about 600 angstroms.

10. A method in accordance with claim 8 wherein the refractive index is between about 1.1 and 1.45.

11. A method in accordance with claim 10 wherein the refractive index is between about 1.33 and 1.43.

12. A method in accordance with claim 8 wherein the article comprises diamond.

13. A method in accordance with claim 8 wherein the article is a capacitive information disc record playback stylus.

14. A method in accordance with claim 8 wherein the process parameters are selected from the group consisting of the N$_2$O flow rate, the SiH$_4$ flow rate, the partial pressure of N$_2$O, the partial pressure of SiH$_4$ and the partial pressure ratio of SiH$_4$ to N$_2$O.

* * * * *